(12) United States Patent
Taurasi et al.

(10) Patent No.: US 10,370,875 B2
(45) Date of Patent: *Aug. 6, 2019

(54) ELECTRICAL VEHICLE LATCH HAVING A FLUID TIGHT ELECTRICAL HOUSING

(71) Applicant: Magna Closures S.P.A., Guasticce (Leghorn) (IT)

(72) Inventors: Marco Taurasi, Leghorn (IT); Francesco Cumbo, Pisa (IT)

(73) Assignee: MAGNA CLOSURES S.P.A., Guasticce (Livorno) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/967,807

(22) Filed: May 1, 2018

(65) Prior Publication Data
US 2018/0245379 A1    Aug. 30, 2018

Related U.S. Application Data

(63) Continuation of application No. 15/023,750, filed as application No. PCT/EP2014/070583 on Sep. 25, 2014, now Pat. No. 9,957,736.
(Continued)

(51) Int. Cl.
*H05K 5/00* (2006.01)
*E05B 77/34* (2014.01)
(Continued)

(52) U.S. Cl.
CPC .............. *E05B 77/34* (2013.01); *E05B 81/06* (2013.01); *E05B 81/56* (2013.01); *E05B 85/02* (2013.01);
(Continued)

(58) Field of Classification Search
CPC ........ H02K 5/225; H02K 11/30; E05B 77/34; E05B 85/02; E05B 81/54; E05B 81/56;
(Continued)

(56) References Cited

U.S. PATENT DOCUMENTS 5,474,339 A * 12/1995 Johnson ................. E05B 81/06
292/201
6,881,912 B2    4/2005 Kobayashi et al.
(Continued)

FOREIGN PATENT DOCUMENTS

DE    4221137 A1    1/1994
DE    10111085 A1    9/2002
(Continued)

OTHER PUBLICATIONS

International Search Report dated Feb. 4, 2015 from International Patent Application Serial No. PCT/EP2014/070583.

*Primary Examiner* — James Wu
(74) *Attorney, Agent, or Firm* — Dickinson Wright PLLC

(57) ABSTRACT

A method of making an electrical latch assembly for a door of a vehicle. The method includes providing an electrical housing having a fluid-tight open interior and an opening. The method also includes positioning a printed circuit board in the fluid-tight open interior, wherein the printed circuit board has an electrical control unit. The method further includes connecting a latch mechanism to the electrical housing about the opening, the latch mechanism including an electric motor. The method also includes extending an electrical connector from the printed circuit board, through the opening of the latch mechanism and to the electrical motor to establish an electrical connection between the printed circuit board and the electric motor.

20 Claims, 10 Drawing Sheets

Related U.S. Application Data

(60) Provisional application No. 61/882,320, filed on Sep. 25, 2013.

(51) Int. Cl.
| | | |
|---|---|---|
| *E05B 85/02* | (2014.01) | |
| *E05B 81/06* | (2014.01) | |
| *E05B 81/56* | (2014.01) | |
| *H05K 5/06* | (2006.01) | |
| *E05B 81/30* | (2014.01) | |
| *E05B 81/54* | (2014.01) | |

(52) U.S. Cl.
CPC .............. *H05K 5/069* (2013.01); *E05B 81/30* (2013.01); *E05B 81/54* (2013.01)

(58) Field of Classification Search
CPC ......... E05B 85/06; E05B 81/30; H05K 5/069; H05K 5/061
See application file for complete search history.

(56) References Cited

U.S. PATENT DOCUMENTS

| | | |
|---|---|---|
| 2003/0137202 A1 | 7/2003 | Mao et al. |
| 2009/0243308 A1 | 10/2009 | Ishiguro et al. |
| 2012/0096905 A1 | 4/2012 | Yamagata et al. |
| 2014/0175813 A1 | 6/2014 | Margheritti et al. |

FOREIGN PATENT DOCUMENTS

| | | |
|---|---|---|
| DE | 20307111 U1 | 9/2004 |
| DE | 202006007263 U1 | 7/2006 |
| DE | 102011076560 A1 | 11/2012 |
| EP | 0831562 A1 | 3/1998 |
| EP | 0894924 A1 | 2/1999 |
| EP | 1074680 A1 | 2/2001 |
| EP | 1536090 A2 | 6/2005 |
| EP | 1811107 A2 | 7/2007 |
| GB | 2295199 A | 5/1996 |
| JP | H07032145 U | 6/1995 |
| JP | 2001311338 A | 11/2001 |
| JP | 2004092204 A | 3/2004 |
| JP | 2005163456 A | 6/2005 |
| JP | 2013007202 A | 1/2013 |
| WO | WO9703268 A1 | 1/1997 |

\* cited by examiner

ELECTRICAL VEHICLE LATCH HAVING A FLUID TIGHT ELECTRICAL HOUSING

CROSS-REFERENCE TO RELATED APPLICATIONS

This Application is a continuation of U.S. patent application Ser. No. 15/023,750 filed Mar. 22, 2016 and issuing May 1, 2018 as U.S. Pat. No. 9,957,736, which is a U.S. National Stage patent application claiming priority to PCT International Patent Application Serial No. PCT/EP2014/070583 filed Sep. 25, 2014, which claims the benefit of U.S. Provisional Patent Application Ser. No. 61/882,320 filed Sep. 25, 2013, entitled "An Electrical Vehicle Latch". The entire disclosures of each of the above applications are incorporated herein by reference.

BACKGROUND

1. Field of the Invention

The present invention relates to electrical latch assemblies for vehicle doors.

2. Related Art

Electrical latch assemblies are an increasingly popular alternative to purely mechanical latch assemblies for vehicle doors. In addition to providing a vehicle with an item that many customers consider to be a luxury feature, electrical latch assemblies also provide a number of benefits to the vehicle manufacturers themselves. For example, because an electrical latch assembly does not require a mechanical linkage between handles on both the inside and outside of the vehicle door, the vehicle manufacturer may place buttons or any other triggers in locations that are less noticeable to the occupants of the vehicle and would not otherwise be accessible for handles of purely mechanical door latch assemblies. Additionally, electrical latch assemblies may be more reliable and/or easy to repair than purely mechanical latch assemblies which include a number of components that are susceptible to wear or damage.

Generally, electrical latch assemblies for vehicle doors include both mechanical components and electrical components. The mechanical components are moveable between an open position and a closed position for engaging a striker on a vehicle body, and the electrical components receive instructions from the vehicle's electrical system to open the mechanical components thereby disengaging the striker and allowing the vehicle door to pivot relative to the vehicle body.

One known problem with electrical latch assemblies for vehicle doors involves protecting the electrical components of electrical latch assemblies from water, grease or other fluids that could cause damage to or even complete failure of these electrical components. One approach to protecting the electrical components from fluids is to position them in a location of the vehicle door that is unlikely to be exposed to fluids. However, this may require that the electrical components of the electrical latch assembly be located in a different area of the vehicle door from the mechanical components that often are exposed, to at least some extent, to fluids and may even contain grease.

SUMMARY

One aspect provides for a method of making an electrical latch assembly for a door of a vehicle. The method includes providing an electrical housing having a fluid-tight open interior and an opening. The method also includes positioning a printed circuit board in the fluid-tight open interior, wherein the printed circuit board has an electrical control unit. The method further includes connecting a latch mechanism to the electrical housing about the opening, the latch mechanism including an electric motor. The method also includes extending an electrical connector from the printed circuit board, through the opening of the latch mechanism and to the electrical motor to establish an electrical connection between the printed circuit board and the electric motor.

Such an electrical latch assembly is advantageous because the PCB and ECU, which may be susceptible to damage if exposed to fluids, are located in the fluid-tight open interior of the electrical housing and are protected from water, grease and other fluids. The electrical housing with the PCB and ECU may be placed in any suitable location within the vehicle door irrespective of whether that location might be exposed to water, grease or other fluids. This is in contrast to other known electrical latch assemblies which require that the electrical components be located in a portion of the vehicle door that is not exposed to fluids.

According to another aspect, the latch mechanism has a latch housing with an outer surface that presents a motor seat that supports the electric motor for opening and closing the latch mechanism to engage or release a striker on the vehicle body. The method further includes positioning a seal about the motor seat and between the latch housing and the electrical housing to establish a fluid-tight seal between the latch housing and the electrical housing. The seal about the motor seat ensures that no fluid is able to pass between the motor seat and the electrical housing.

BRIEF DESCRIPTION OF THE DRAWINGS

These and other features and advantages of the present invention will be readily appreciated, as the same becomes better understood by reference to the following detailed description when considered connection with the accompanying drawings wherein.

DETAILED DESCRIPTION OF EXAMPLE EMBODIMENTS

Figure 1:
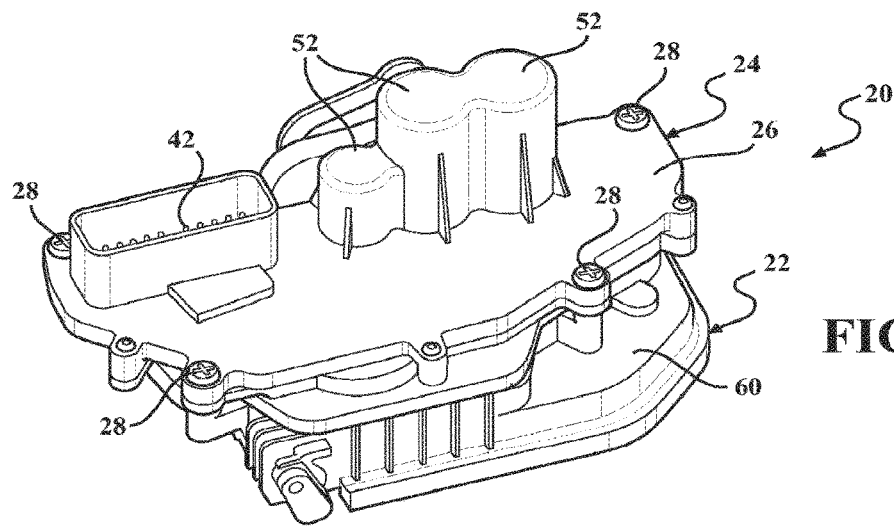
FIG. 1 is a perspective and elevation view of an exemplary electrical latch assembly.
Figure 2:
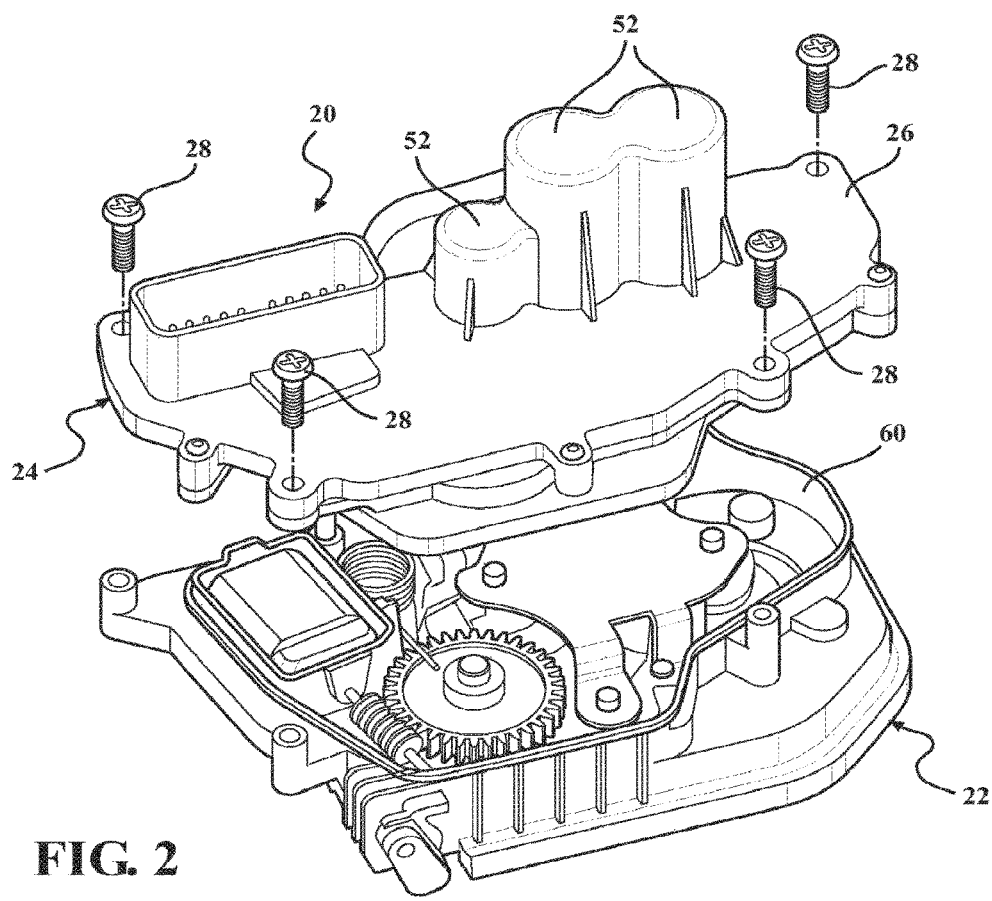
FIG. 2 is a perspective and partially exploded view of the exemplary latch assembly of FIG. 1.

The following description is merely exemplary in nature and is not intended to limit the present disclosure, application or uses. It should be understood that throughout the drawings, corresponding reference numerals indicate like or corresponding parts and features.

An exemplary embodiment of an electrical latch assembly 20 for releasably latching a vehicle door (not shown) to a vehicle body (not shown) is generally shown in FIG. 1. Broadly, the electrical latch assembly 20 includes a latch mechanism 22 and an electrical portion 24. The latch mechanism 22 includes the mechanical components of the latch assembly for selectively opening and closing to release or engage a striker (not shown) on the vehicle body. The electrical portion 24 has a fluid-tight electrical housing 26 which contains the electrical components of the latch assembly to protect those components from fluid damage. This allows the entire electrical latch assembly 20 to be positioned in areas of the vehicle door that may be exposed to water, grease or other fluids that could otherwise damage the electrical components that are protected by the fluid-tight electrical housing 26 of the electrical portion 24. The latch mechanism 22 and the electrical housing 26 are joined together with a plurality of fasteners 28 or any suitable connection means. The electrical portion 24 and the latch mechanism 22 may be joined together and installed in the vehicle door as a single unit. This may allow for certain manufacturing advantages by simplifying the assembly of the vehicle door.

The electrical portion 24 is very versatile because it may be affixed to a range of different types of latch mechanisms 22. Depending on the particular application to which the electrical latch assembly 20 is configured, the latch mechanism 22 may be a single plane latch mechanism 22 as is shown in the exemplary embodiment or may be a dual plane latch mechanism (not shown). As such, cost savings through economies of scale may be realized by using the same electrical portions 24 in conjunction with the latch mechanisms of differing vehicles.

Figure 3:
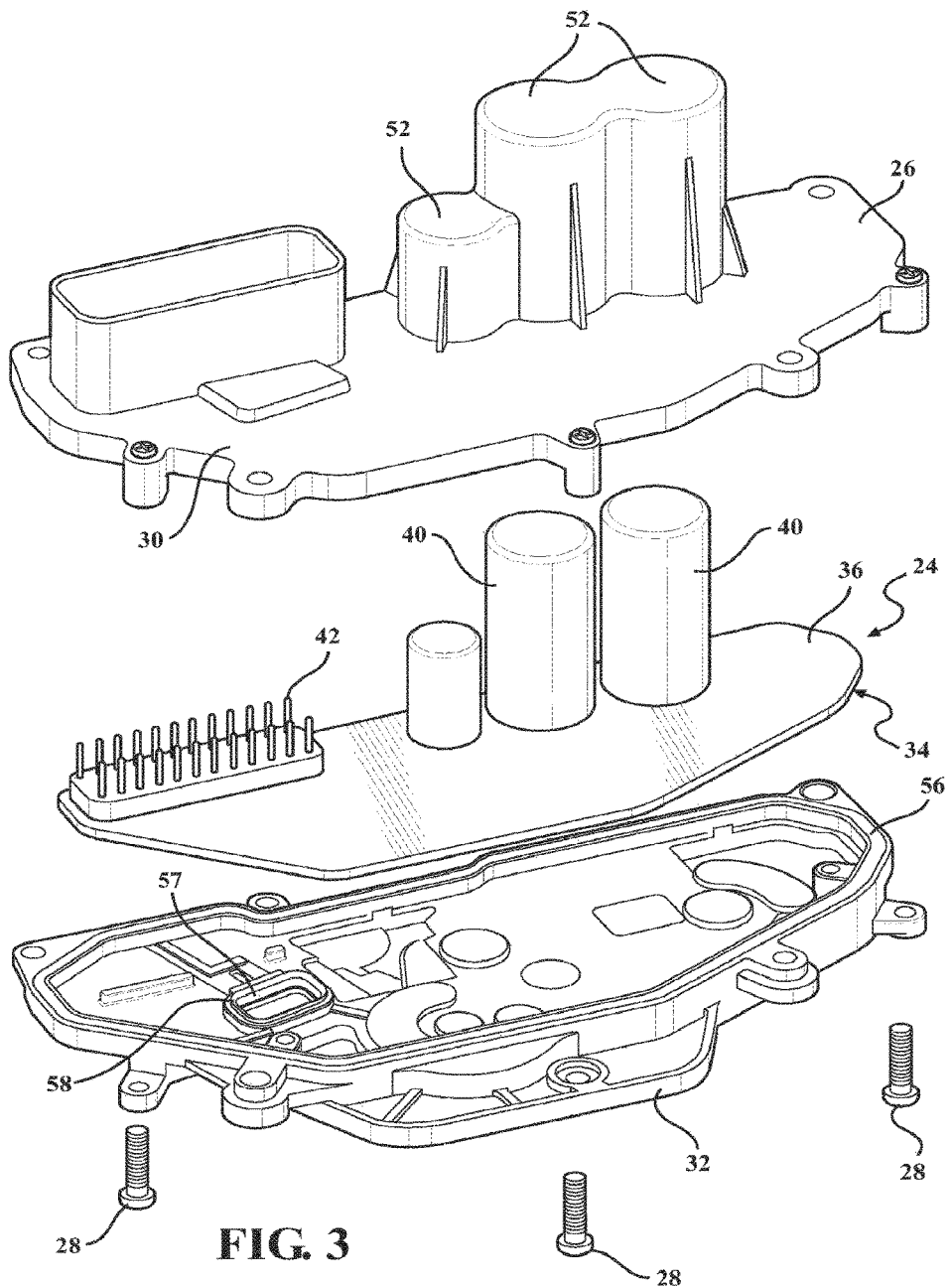
FIG. 3 is a perspective and partially exploded view of an electrical portion of the exemplary latch assembly of FIG. 1.
Figure 4:
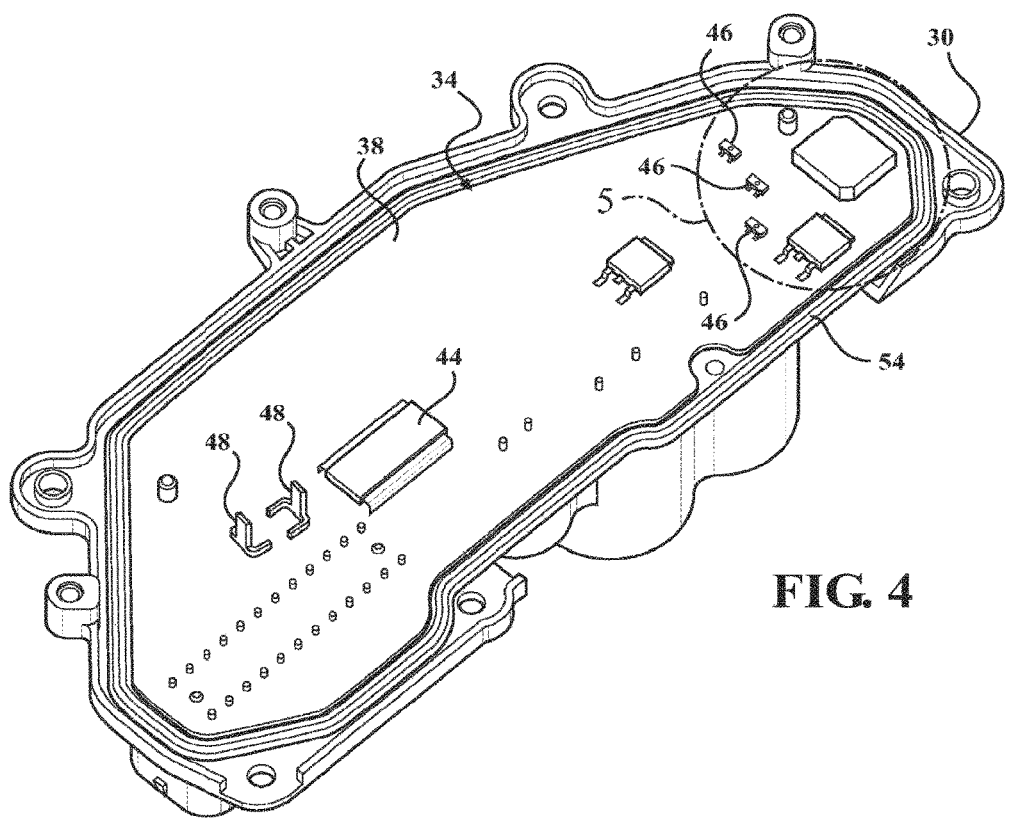
FIG. 4 is a perspective view showing a printed circuit board of the electrical portion of the exemplary latch assembly of FIG. 1.
Figure 5:
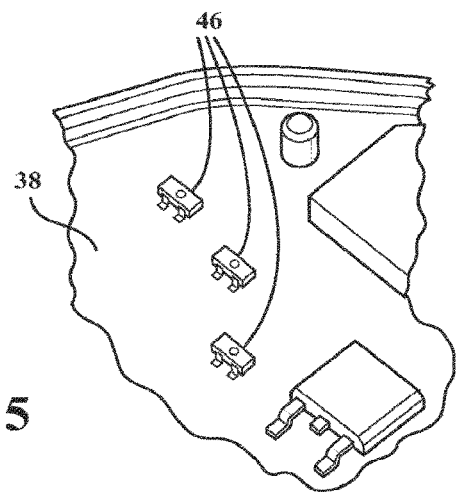
FIG. 5 is a fragmentary and enlarged view of a portion of the printed circuit board and showing a plurality of latch sensors.

Referring now to FIG. 3, the exemplary embodiment of the electrical portion 24 is shown. The fluid-tight electrical housing 26 includes a first cover piece 30 and a second cover piece 32 which are joined and sealed with one another to present a fluid-tight, open interior. A generally printed circuit board (PCB 34) with opposing first and second surfaces 36, 38 is contained within the fluid-tight interior between the first and second cover pieces 30, 32. In the exemplary embodiment, a plurality of electrical power sources 40, such as batteries, capacitors or fuel cells are positioned on the first surface 36 of the PCB 34. Because the electrical latch assembly 20 includes its own power source 40, it is operable even if the vehicle battery (not shown) is out of power. An electrical port 42 for receiving electrical signals from the vehicle's electrical system is also positioned on the first surface 36 of the PCB 34. Specifically, the electrical port 42 is configured to receive an electrical signal from one or more buttons or handles on the interior or exterior of the vehicle door to instruct the electrical latch mechanism 22 to release the striker thereby allowing the vehicle door to open. As shown in FIG. 4, an electrical control unit (ECU 44), a plurality of latch sensors 46 and a pair of electrical terminals 48 (or motor pins) are located on the second surface 38 of the PCB 34. In operation, the latch sensors 46 monitor the condition of the latch mechanism 22 (opened or closed), the ECU 44 operates the power sources 40 to apply instructions through the electrical port 42 from the vehicle's electrical system to open the latch mechanism 22 and the ECU 44 applies a voltage difference across the electrical terminals 48 to power an electric motor 50 (shown in FIGS. 10 and 11) in the latch mechanism 22, thereby releasing the latch mechanism 22 from engagement with the striker to allow the vehicle door to pivot relative to the vehicle body.

Referring back to FIG. 3, in the exemplary embodiment, the first cover piece 30 is shaped to partially surround the various electrical components on the first surface 36 of the PCB 34 while minimizing occupied space. More specifically, the first cover piece 30 has a plurality of seats 52 for receiving the power sources 40 and an opening configured to receive a cable (now shown) for establishing electrical communication between the vehicle's electrical system and the electrical port 42 on the first surface 36 of the PCB 34.

Figure 9:
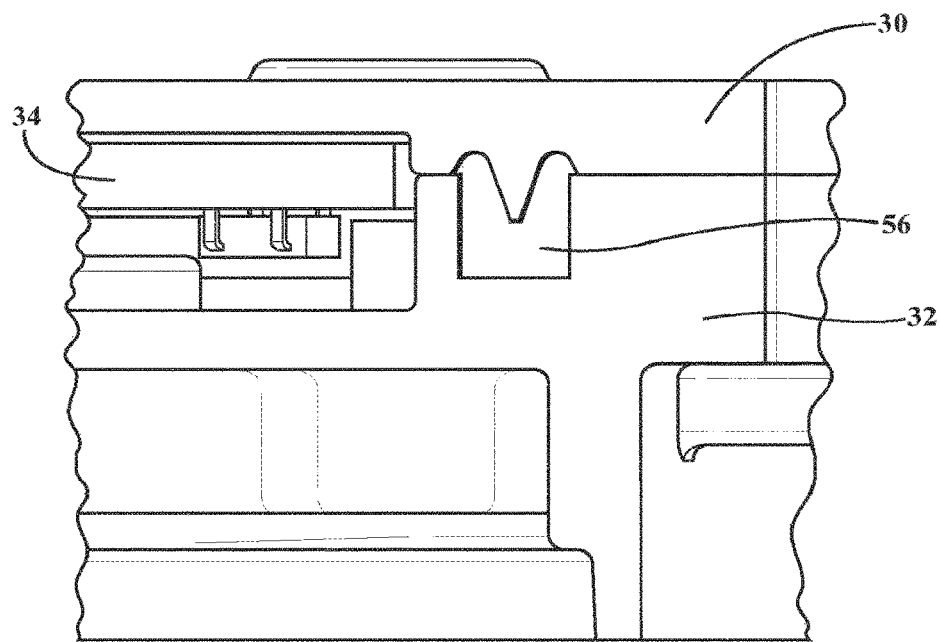
FIG. 9 is a fragmentary and cross-sectional view showing the first and second cover pieces being sealed with one another by a first seal.

As best shown in FIG. 4, the first cover piece 30 of the exemplary electrical housing 26 includes a channel 54 which is formed integrally into the first cover piece 30, is generally planar and extends through an enclosed loop around the PCB 34. Referring back to FIG. 3, a first seal 56 is positioned within a similarly-shaped channel in the second cover piece 32. As best shown in FIG. 9, when the first and second cover pieces 30, 32 are joined together, the first seal 56 is compressed between the first and second cover pieces 30, 32 to establish the fluid-tight seal therebetween thereby restricting the passage of fluid into the open interior with the PCB 34 (shown in FIG. 3). The first seal 56 of the exemplary embodiment is generally V-shaped when viewed in cross-section. This particular shape provides for a particularly effective and resilient fluid-tight seal. However, it should be appreciated that the first seal 56 could have any suitable shape for establishing the fluid-tight seal between the first and second cover pieces 30, 32.

Figure 6:
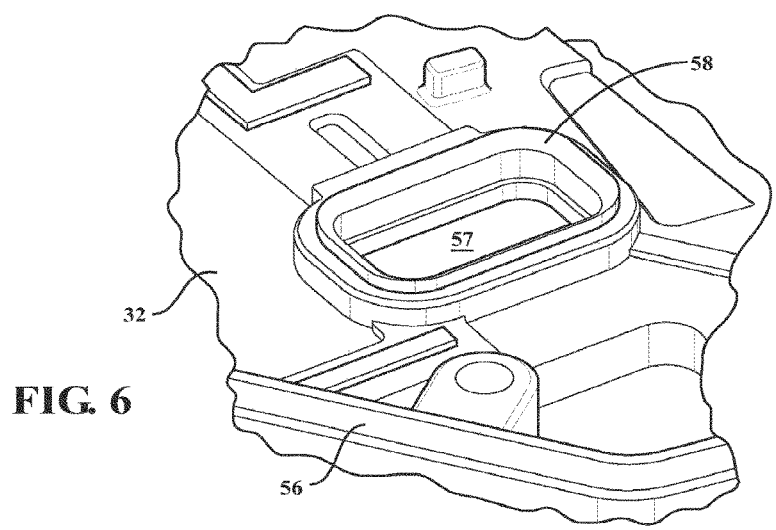
FIG. 6 is a fragmentary and enlarged view of a portion of a second cover piece of the electrical portion and showing an opening with a seal extending therearound.
Figure 7:
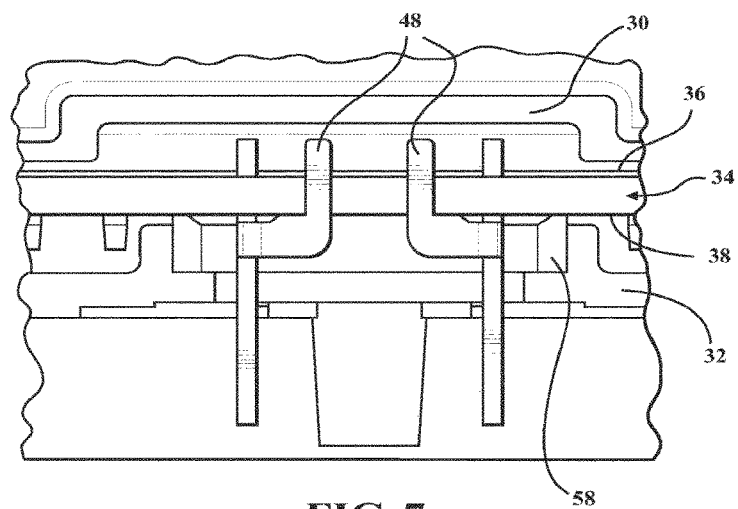
FIG. 7 is a fragmentary and cross-sectional view showing the second cover piece of being sealed against the printed circuit board and showing a pair of terminals extending through the opening in the second cover piece.
Figure 8:
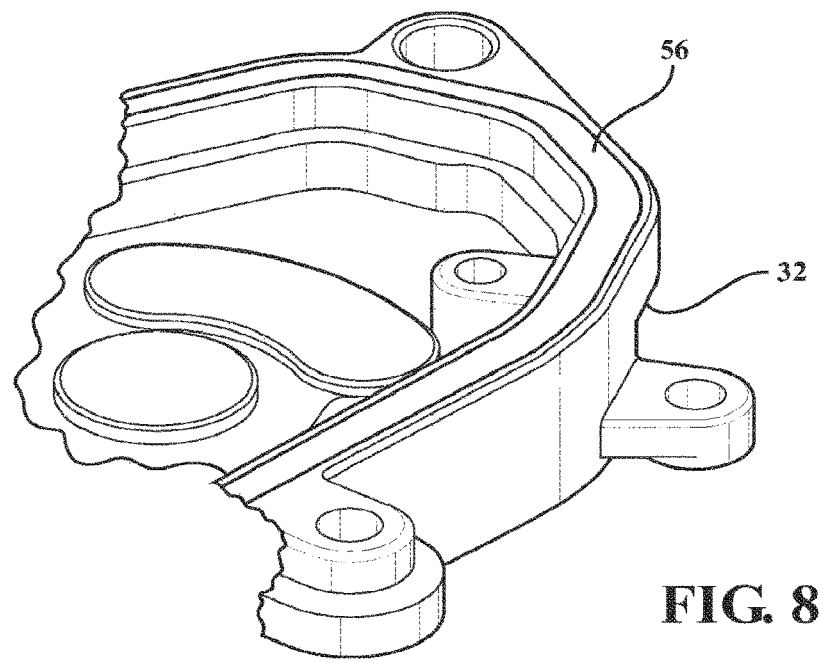
FIG. 8 is a fragmentary and enlarged view showing a portion of the second cover piece with a first seal.

Referring now to FIGS. 3, 6 and 7, the second cover piece 32 has an opening 57, through which the electrical terminals 48 extend to establish electrical communication between the PCB 34 and the electric motor 50. A second seal 58 extends around the opening, and establishes a seal between the second cover piece 32 and a water-tight portion of the second surface 38 of the PCB 34 to restrict the passage of fluid into the open interior through the opening in the second cover piece 32. As such, the second seal 58 is positioned between the PCB 34 and the second cover piece 32 of the electrical housing 26 and is sealed against the PCB 34 in the fluid-tight open interior of the electrical housing 26.

Figure 10:
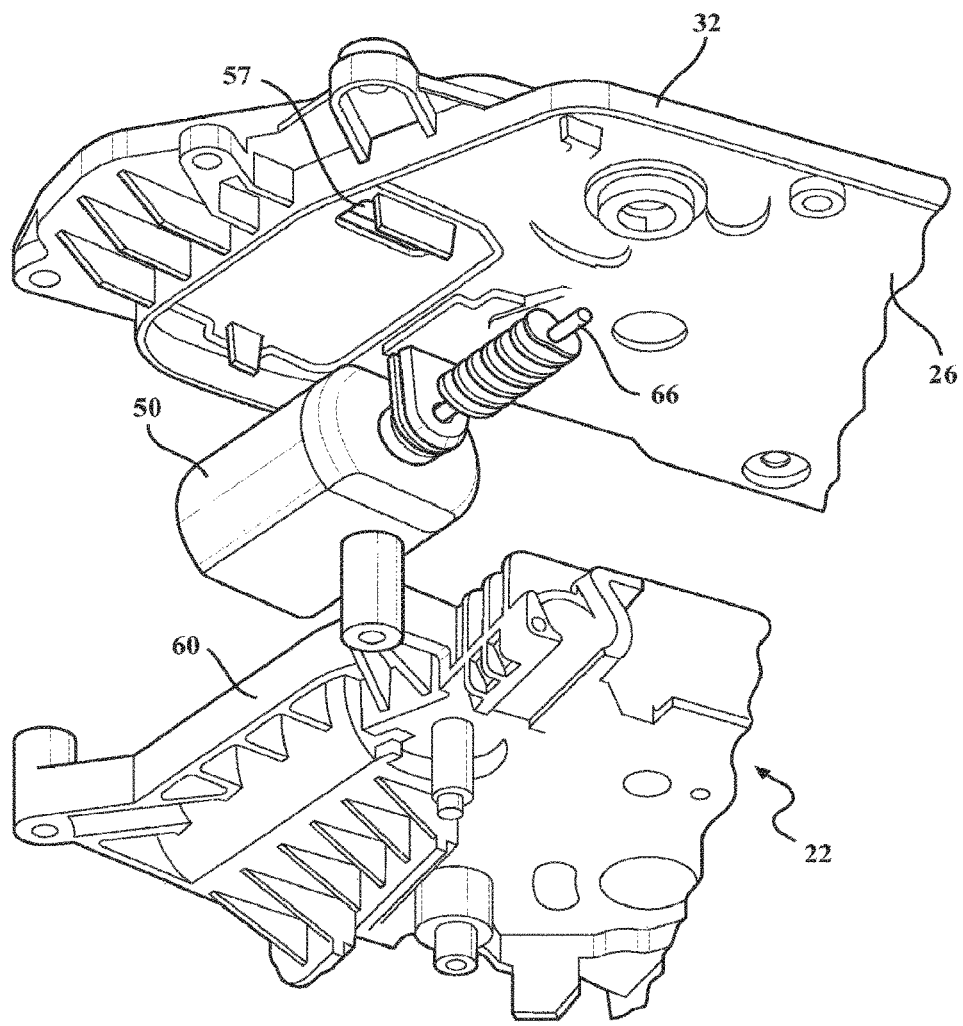
FIG. 10 is a perspective and partially exploded view showing a portion of the electrical housing and a portion of a latch housing with an electric motor positioned therebetween.

As best shown in FIGS. 3 and 10, the first and second cover pieces 30, 32 have a plurality of sets of aligned apertures which are spaced outwardly from the enclosed loop of the first seal 56. At least two of the sets of aligned apertures are configured to receive fasteners 28 for joining the first and second cover pieces 30, 32 together, and at least two of the sets of aligned apertures are configured to receive fasteners 28 for joining the electrical portion 24 with the latch mechanism 22. Because all of the fasteners 28 are located outside of the perimeter of the first seal 56, they do not interfere with or otherwise compromise the fluid-tight interior space between the first and second cover pieces 30, 32.

The first and second cover pieces 30, 32 of the electrical housing 26 are preferably made of a polymeric material and are preferably formed through injection molding processes. However, it should be appreciated that the first and second cover pieces 30, 32 may be made of a range of suitable materials and may be formed through any suitable processes.

Figure 11:
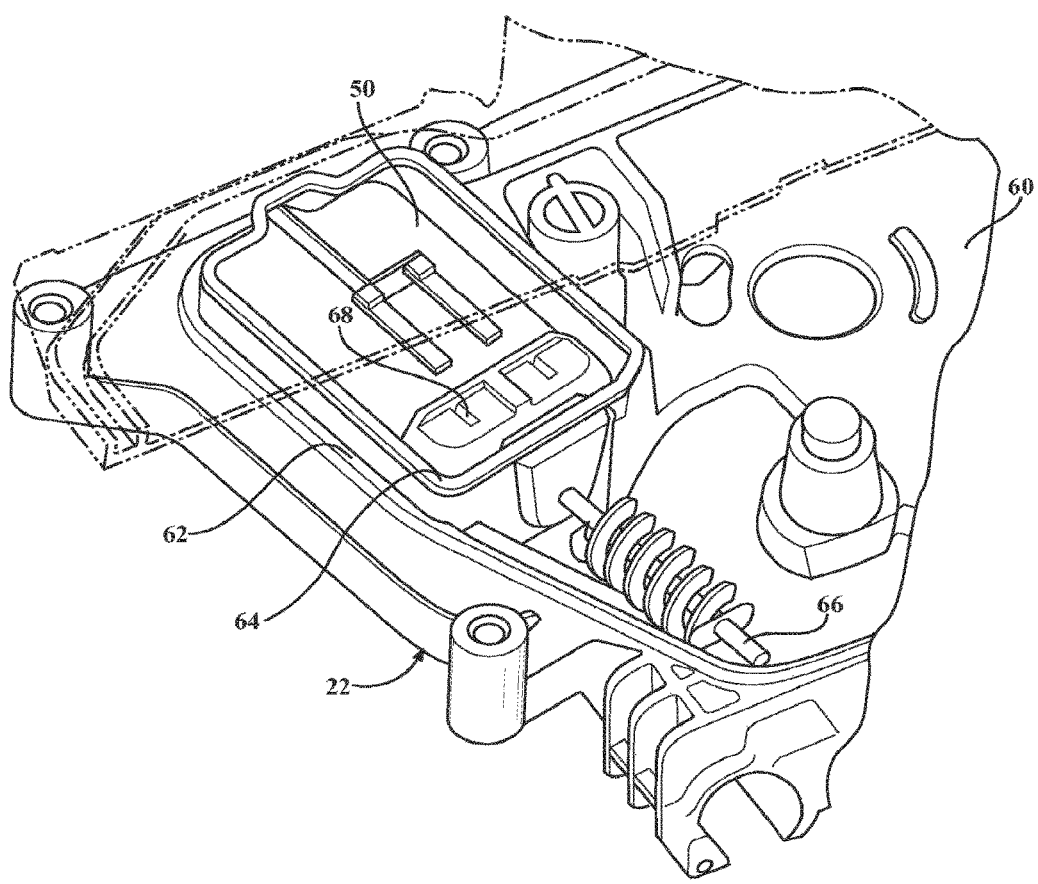
FIG. 11 is a perspective and fragmentary view showing the electric motor positioned within a seat in the latch housing.

Referring now to FIGS. 10 and 11, the latch mechanism 22 has a latch housing 60 with an outer surface that presents a motor seat 62. The electric motor 50 is located within the motor seat 62, and a third seal 64 extends around the perimeter of the electric motor 50. The third seal 64 establishes a fluid-tight seal between the latch housing 60 and the electrical housing 26 to protect the electric motor 50 from water or other fluids. The electric motor 50 also has an output shaft 66 which is also sealed to restrict the passage of fluids into the motor seat 62.

As shown in FIG. 10, the latch housing 60 and the second cover piece 32 are configured such that when they are joined together, the opening 57 in the second cover piece 32 is aligned with the motor seat 62 in the latch housing 60. As such, the electrical terminals 48 (FIG. 7) extend from the PCB 34 into the motor seat 62 to engage with correspondingly-shaped slots 68 (FIG. 11) in the electric motor 50 and establish the electrical connection between the PCB 34 and the electric motor 50.

Figure 12:
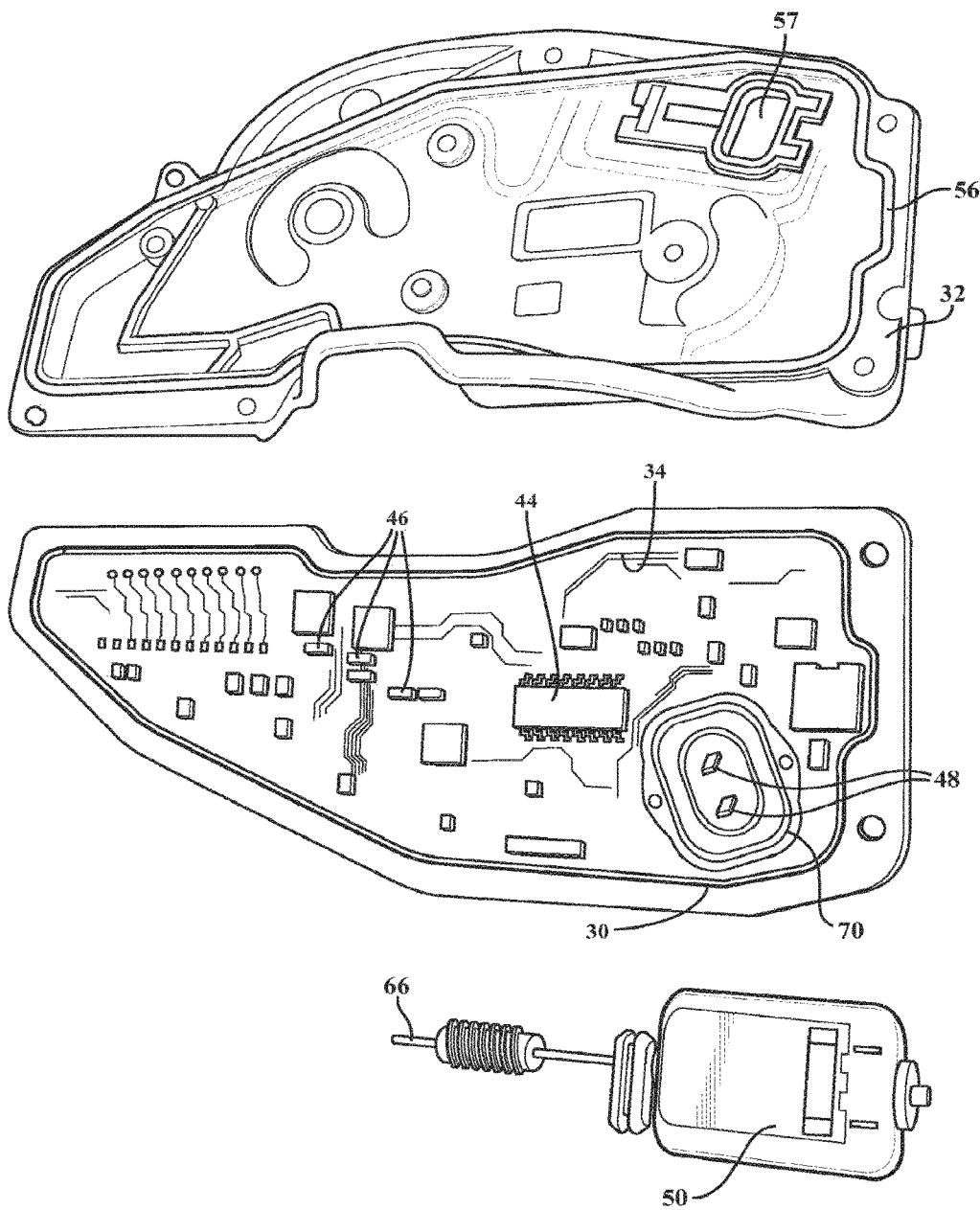
FIG. 12 is a partially exploded view showing the first and second cover pieces of the exemplary embodiment being separated from one another and showing the printed circuit board being placed in the first cover piece.
Figure 13:
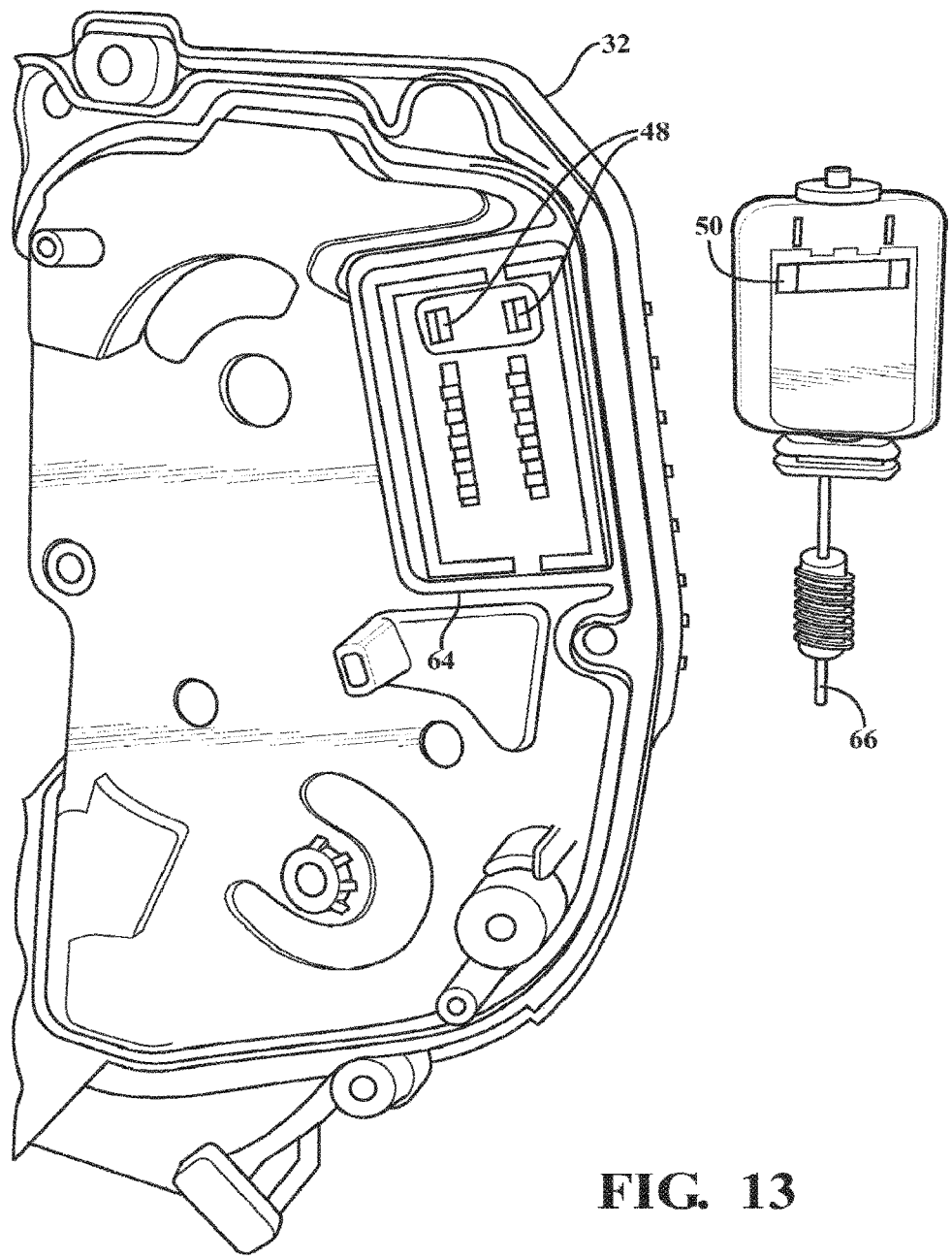
FIG. 13 is a bottom view of the second cover piece of the exemplary embodiment.
Figure 14:
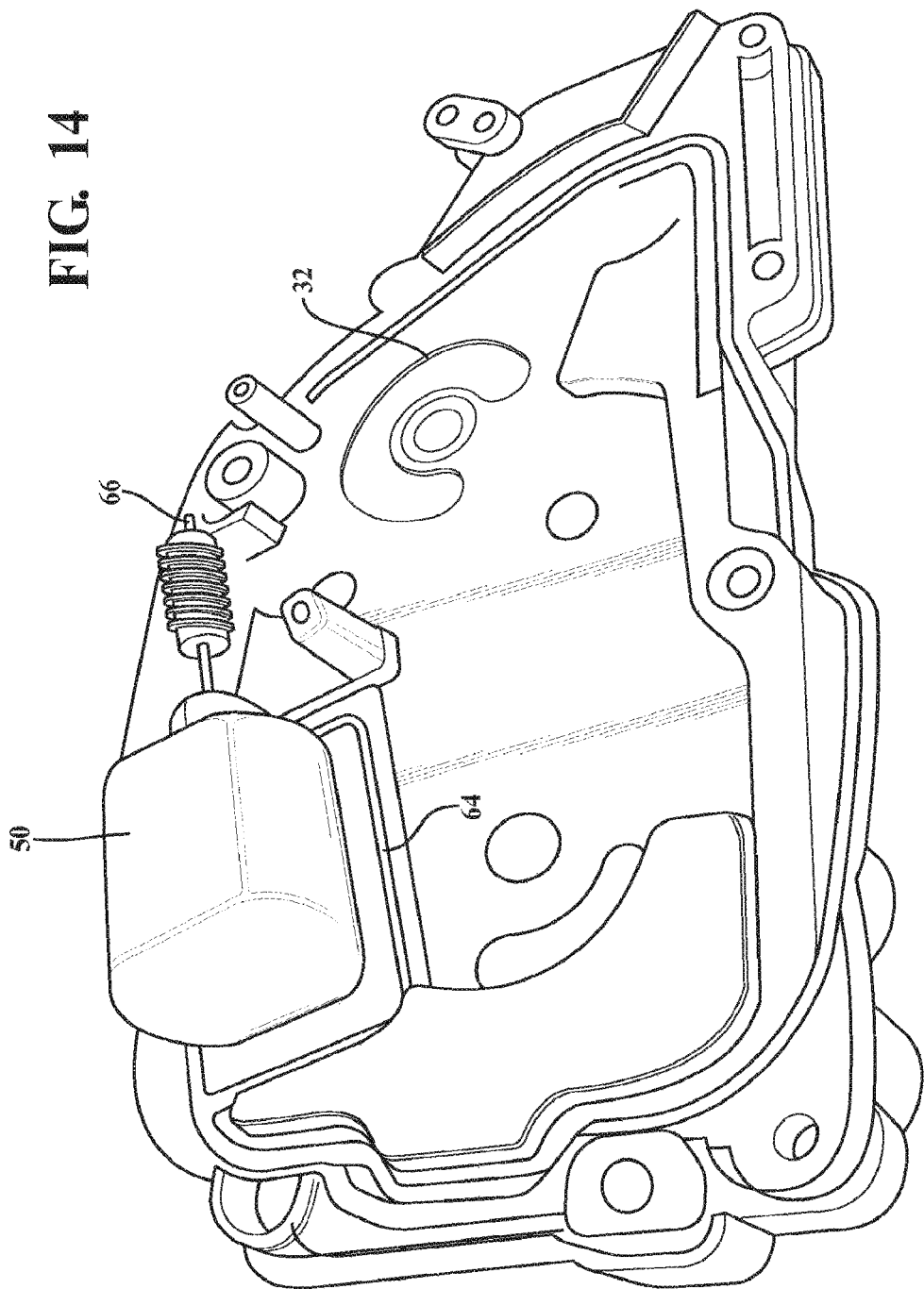
FIG. 14 is another bottom view of the second cover piece of the exemplary embodiment and with the electric motor connected with the electrical connectors attached to the printed circuit board.

FIG. 12 is a partially exploded view showing the first and second cover pieces 30, 32 of the exemplary embodiment being separated from one another and showing the PCB 34 being placed in the first cover piece 30. An electrical connector, for example a pair of electrical terminals 48, extends upwardly from the second surface 38 of the PCB 34. A fourth seal 70 is shown to extend around the electrical terminals 48 for engaging the second seal 58 of the first cover piece 30.

Furthermore, the foregoing discussion discloses and describes merely exemplary embodiments of the present disclosure. One skilled in the art will readily recognize from such discussion and from the accompanying drawings and claims that various changes, modifications and variations may be made therein without departing from the spirit and scope of the disclosure defined in the following claims.

What is claimed is:

1. A method of making an electrical latch assembly for a door of a vehicle, the method comprising:
   providing an electrical housing having a fluid-tight open interior and an opening;
   positioning a printed circuit board in the fluid-tight open interior, wherein the printed circuit board has an electrical control unit;
   connecting a latch mechanism to the electrical housing about the opening, the latch mechanism including an electric motor; and
   extending an electrical connector from the printed circuit board, through the opening of the latch mechanism and to the electrical motor to establish an electrical connection between the printed circuit board and the electric motor.

2. The method as set forth in claim 1 wherein the electrical housing includes a first cover piece and a second cover piece together defining the open interior, and wherein the method further includes connecting the first and second cover pieces together.

3. The method as set forth in claim 2 further including positioning at least one seal between the first and second cover pieces of the electrical housing to seal the open interior.

4. The method as set forth in claim 3 wherein positioning the at least one seal between the first and second cover pieces includes positioning the at least one seal about a perimeter of the printed circuit board.

5. The method as set forth in claim 3 wherein positioning the at least one seal between the first and second cover pieces further includes positioning the at least one seal in a channel defined by one of the first and second cover pieces.

6. The method as set forth in claim 1 further including positioning an electrical power source in the open interior of the electrical housing, and electrically connecting the electrical power source with the printed circuit board.

7. The method as set forth in claim 1 further including positioning at least one latch sensor on the printed circuit board in the open interior of the electrical housing.

8. The method as set forth claim 1 wherein the at least one electrical connector includes a pair of electrical terminals.

9. The method as set forth in claim 1 wherein the latch mechanism includes a latch housing.

10. The method as set forth in claim 9 wherein the latch housing has a motor seat which supports the electric motor.

11. The method as set forth in claim 10 further including positioning a seal between the electrical housing and the motor seat for restricting the passage of fluids between the electrical housing and the motor seat.

12. The method as set forth in claim 1 further including positioning a seal between the electrical housing or the latch mechanism and the printed circuit board.

13. The method as set forth in claim 12 wherein the seal is angled to seal about the at least one electrical connector extending from the printed circuit board.

14. The method as set forth in claim 12 wherein the seal is positioned against the printed circuit board in the open interior of the electrical housing.

15. A method of making an electrical latch assembly for a door of a vehicle, said method comprising:
   providing an electrical housing defining an open interior and an opening into the open interior;
   positioning a printed circuit board in the open interior, the printed circuit board including a first surface with at least one electrical terminal positioned thereon and a second surface;
   extending the electrical terminal through the opening of the electrical housing;
   securing a latch housing to the electrical housing, the latch housing defining a motor seat;
   positioning an electric motor on the motor seat;
   electrically connecting the electrical terminal and the electric motor to establish an electrical connection between the printed circuit board and the electric motor;
   positioning a first seal about the opening and between the electrical housing and the second surface of the printed circuit board to establish a fluid-tight seal between the electrical housing and the second surface of the printed circuit board; and positioning a second seal about the motor seat and between the latch housing and the electrical housing to establish a fluid-tight seal between the latch housing and the electrical housing.

16. The method as set forth in claim 15 wherein the electrical housing includes first and second cover pieces, and wherein the method further includes positioning the first and second cover pieces against one another to define the open interior.

17. The method as set forth in claim 16 further including positioning a third seal between the first and second cover pieces, and positioning the first and second cover pieces against each other with the seal positioned therebetween to seal the open interior.

18. The method as set forth in claim 16 wherein positioning the first seal about the opening and between the electrical housing and the second surface of the printed circuit board includes positioning the first seal between the second cover piece of the electrical housing and the second surface of the printed circuit board.

19. The method as set forth in claim 16 and wherein positioning the second seal about the motor seat and between the latch housing and the electrical housing includes positioning the second seal between the latch housing and the second cover piece of the electrical housing.

20. The method as set forth in claim 16 further including securing the first and second cover pieces together with fasteners, and securing the electrical housing to the latch housing with fasteners.

* * * * *